(12) United States Patent
Huang (10) Patent No.: US 12,342,505 B2
(45) Date of Patent: Jun. 24, 2025

(54) HEAT DISSIPATION STRUCTURE, HEAT DISSIPATION COMPONENT AND MOUNTING METHOD THEREFOR, AND FOLDABLE TERMINAL

(71) Applicant: ZTE CORPORATION, Shenzhen (CN)

(72) Inventor: Zhulin Huang, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 429 days.

(21) Appl. No.: 18/004,192

(22) PCT Filed: Aug. 10, 2021

(86) PCT No.: PCT/CN2021/111819
§ 371 (c)(1),
(2) Date: Jan. 4, 2023

(87) PCT Pub. No.: WO2022/033481
PCT Pub. Date: Feb. 17, 2022

(65) Prior Publication Data
US 2023/0247798 A1 Aug. 3, 2023

(30) Foreign Application Priority Data
Aug. 14, 2020 (CN) .................. 202010816393.9

(51) Int. Cl.
*H04M 1/05* (2006.01)
*H04B 1/036* (2006.01)
(Continued)

(52) U.S. Cl.
CPC .......... *H05K 7/2039* (2013.01); *H04B 1/036* (2013.01); *H04M 1/0206* (2013.01)

(58) Field of Classification Search
CPC ............. H05K 7/2039; H05K 7/20454; H05K 7/20963; H04B 1/036; H04M 1/0206;
(Continued)

(56) References Cited

U.S. PATENT DOCUMENTS

2013/0163205 A1\* 6/2013 Zhang ................... H01L 23/373
361/705
2018/0284856 A1\* 10/2018 Shah ..................... G06F 1/1616
(Continued)

FOREIGN PATENT DOCUMENTS

| CN | 103694706 A | 4/2014 |
| CN | 104119627 A | 10/2014 |

(Continued)

OTHER PUBLICATIONS

IP.com search (Year: 2025).\*
(Continued)

*Primary Examiner* — Moustapha Diaby
(74) *Attorney, Agent, or Firm* — Vivacqua Crane, PLLC (57) ABSTRACT

Disclosed are a heat dissipation structure, a heat dissipation component and a mounting method thereof, and a foldable terminal device. The heat dissipation structure may include: a plurality of elastic heat conduction units; and at least one layer of heat conduction mesh, the heat conduction mesh includes a plurality of interlaced mesh wires, each two interlaced mesh wires are rotatable relative to each other, and the plurality of mesh wires are interlaced to form gaps in which the elastic heat conduction units are arranged.

12 Claims, 6 Drawing Sheets

(51) Int. Cl.
*H04M 1/02* (2006.01)
*H04M 1/23* (2006.01)
*H05K 7/20* (2006.01)

(58) Field of Classification Search
CPC ... H04M 1/0214; H04M 1/0268; G06F 1/203; G06F 1/1616; G06F 2200/203; G09F 9/301; H01L 23/36; H01L 23/3733
USPC ...................................................... 455/575.3
See application file for complete search history.

(56) References Cited

U.S. PATENT DOCUMENTS

2019/0041922 A1* 2/2019 Kurma Raju ........ H05K 7/2039
2020/0245501 A1* 7/2020 Wu ........................... F28F 3/02

FOREIGN PATENT DOCUMENTS

| CN | 104559184 A | 4/2015 |
|---|---|---|
| CN | 104861298 A | 8/2015 |
| CN | 204906943 U | 12/2015 |
| CN | 105273540 A | 1/2016 |
| CN | 107554017 A | 1/2018 |
| CN | 108447886 A | 8/2018 |
| CN | 109348008 A | 2/2019 |
| CN | 109735306 A | 5/2019 |
| CN | 110591127 A | 12/2019 |
| CN | 210324970 U | 4/2020 |
| CN | 112492835 A | 3/2021 |

OTHER PUBLICATIONS

International Searching Authority. International Search Report and Written Opinion for PCT Application No. PCT/CN2021/111819 and English translation, mailed Oct. 26, 2021, pp. 1-14.

European Patent Office. Extended European Search Report for EP Application No. 21855533.2, mailed Oct. 31, 2023, pp. 1-9.

* cited by examiner

HEAT DISSIPATION STRUCTURE, HEAT DISSIPATION COMPONENT AND MOUNTING METHOD THEREFOR, AND FOLDABLE TERMINAL

CROSS-REFERENCE TO RELATED APPLICATION

This application is a national stage filing under 35 U.S.C. § 371 of international application number PCT/CN2021/111819, filed Aug. 10, 2021, which claims priority to Chinese patent application No. 202010816393.9, filed Aug. 14, 2020. The contents of these applications are incorporated herein by reference in their entirety.

TECHNICAL FIELD

Embodiments of the present disclosure relate to, but are not limited to, the technical field of mobile terminal devices, and in particular to a heat dissipation structure, a heat dissipation component and a mounting method thereof, and a foldable terminal device.

BACKGROUND

With the development of science and technology, large-screen flexible display devices have become a prevailing trend. The foldability of the flexible display makes it possible for flexible display devices to fold, i.e., forming foldable terminal devices, providing great convenience for carrying large-screen flexible display devices.

In some cases, all conventional heat dissipation structures are rigid, so they cannot be stretched, and can be easily broken when bent. For a foldable terminal device, it has two operating states: a folded state and an unfolded state. However, since the conventional heat dissipation structure cannot be stretched and shrunk to meet a distance difference between the folded state and unfolded state of the foldable terminal device, it is difficult to apply the conventional heat dissipation structure in heat dissipation of the foldable terminal device.

SUMMARY

The following is a summary of the topic described in detail herein. This summary is not intended to limit the protection scope of the claims.

Embodiments of the present disclosure provide a heat dissipation structure, a heat dissipation component and a mounting method thereof, and a foldable terminal device.

In accordance with an aspect of the present disclosure, an embodiment provides a heat dissipation structure. The heat dissipation structure may include: a plurality of elastic heat conduction units; and at least one layer of heat conduction mesh. The heat conduction mesh may include a plurality of interlaced mesh wires, each two interlaced mesh wires are rotatable relative to each other, and the plurality of mesh wires are interlaced to form gaps in which the elastic heat conduction units are arranged.

In accordance with another aspect of the present disclosure, an embodiment provides a heat dissipation component, including the heat dissipation structure as described above.

In accordance with another aspect of the present disclosure, an embodiment provides a foldable terminal device. The foldable terminal device may include a housing and the heat dissipation component as described above. The housing is provided with a first heat dissipation surface and a second heat dissipation surface which are rotatable relative to each other, and a slit is arranged between the first heat dissipation surface and the second heat dissipation surface. The heat dissipation component may include: a first heat dissipation part arranged on the first heat dissipation surface, a second heat dissipation part arranged on the second heat dissipation surface, and a connecting part connected with the first heat dissipation part and the second heat dissipation part respectively, and the connecting part passes through the slit. The first heat dissipation part, the second heat dissipation part and the connecting part are each composed of the heat dissipation structure.

In accordance with another aspect of the present disclosure, an embodiment provides a mounting method for a heat dissipation component, which is applied to a foldable terminal device. The foldable terminal device may include a housing and the heat dissipation component as described above. The housing is provided with a first heat dissipation surface and a second heat dissipation surface which are rotatable relative to each other, and a slit is arranged between the first heat dissipation surface and the second heat dissipation surface. The heat dissipation component may include a first heat dissipation part, a second heat dissipation part, and a connecting part connected with the first heat dissipation part and the second heat dissipation part, respectively. The method may include: fixing the first heat dissipation part on the first heat dissipation surface; pulling a corner of the second heat dissipation part until the second heat dissipation part passes through the slit; moving the heat dissipation component towards the slit to make the connecting part pass through the slit; and releasing the corner of the second heat dissipation part and fixing the second heat dissipation part on the second heat dissipation surface.

In accordance with another aspect of the present disclosure, an embodiment provides a foldable terminal device. The foldable terminal device may include the heat dissipation structure as described above or the heat dissipation component as described above.

Other features and advantages of the present disclosure will be set forth in the following description, and will partially become apparent from the description, or may be understood by practicing the present disclosure. The objective and other advantages of the present disclosure can be achieved and obtained by the structure particularly specified in the description, the claims and the accompanying drawings.

BRIEF DESCRIPTION OF DRAWINGS

The accompanying drawings are used to provide a further understanding of the technical scheme of the present disclosure and constitute a part of the description. The accompanying drawings are used in conjunction with the embodiments of the present disclosure to illustrate the technical scheme of the present disclosure, and do not constitute a limitation to the technical scheme of the present disclosure.

DETAILED DESCRIPTION

In order to make the objective, technical scheme and advantages of the present disclosure clear, the present disclosure will be further described in detail below with reference to the accompanying drawings and embodiments. It should be understood that the specific embodiments described herein are merely used to illustrate the present disclosure, and are not intended to limit the present disclosure.

It should be understood that in the description of the embodiments of the present disclosure, "a plurality of" (or "multiple") means one or more than two. "Greater than", "less than", "exceed" and the like should be understood as excluding this number, while "more than", "less than", "within" and the like should be understood as including this number. If described, "first", "second" and the like are merely intended to distinguish technical features and are not intended to be understood as indicating or implying relative importance or implicitly indicating the number of indicated technical features or implicitly indicating the precedence relationship of the indicated technical features.

With the development of science and technology, large-screen flexible display devices have become a prevailing trend. The foldability of the flexible display makes it possible for flexible display devices to fold, that is, forming foldable terminal devices, providing great convenience for carrying large-screen flexible display devices.

In some cases, all conventional heat dissipation structures are rigid, so they cannot be stretched, and can be easily broken when bent. For a foldable terminal device, it has two operating states: a folded state and an unfolded state. However, since the conventional heat dissipation structure cannot be stretched and shrunk to meet a distance difference between the folded state and unfolded state of the foldable terminal device, it is difficult to apply the conventional heat dissipation structure in heat dissipation of the foldable terminal device.

An embodiment of the present disclosure provides a heat dissipation structure, a heat dissipation component and a mounting method thereof, and a foldable terminal device. The heat dissipation structure includes a plurality of elastic heat conduction units and at least one layer of heat conduction mesh. The heat conduction mesh includes a plurality of interlaced mesh wires, each two interlaced mesh wires are rotatable relative to each other, and the plurality of mesh wires are interlaced to form gaps in which the elastic heat conduction units are arranged. Therefore, when the heat conduction mesh is stretched by an external force, the length of the heat conduction mesh along a direction of stretching by the external force will be increased due to stretching, the length perpendicular to the direction of stretching by the external force will be decreased due to shrinkage. At the same time, the elastic heat conduction units will be deformed as well under the drive of the mesh wires, and will be deformed in consistence with the heat conduction mesh. Consequently, the whole heat dissipation structure can be stretched and shrunk to meet the distance difference between the folded state and unfolded state of the foldable terminal device, and will not be broken even when bent or stretched. Moreover, since the elastic heat conduction units with elastic deformability are arranged in the gaps of the heat conduction mesh, heat conduction property can be increased, thus meeting the requirement of the foldable terminal device for heat dissipation. In addition, for the heat dissipation structure with multiple layers of heat conduction meshes, the heat flux of the heat dissipation structure can be further increased under the conditions that the requirements for different heat dissipation material thicknesses are met and the space of a structural design allows, to achieve a better overall heat dissipation performance of the foldable terminal device. Therefore, since the heat dissipation structure according to this embodiment itself can be stretched and shrunk and will not be broken when bent, the requirement of the foldable terminal device for heat dissipation can be met.

Figure 1:
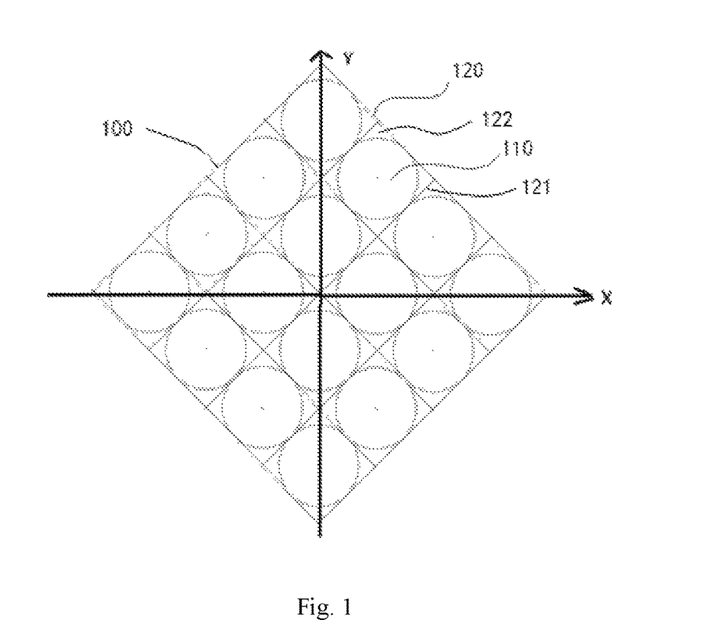
FIG. 1 is a schematic diagram of an unstretched heat dissipation structure using a single layer of heat conduction mesh according to an embodiment of the present disclosure.
Figure 2:
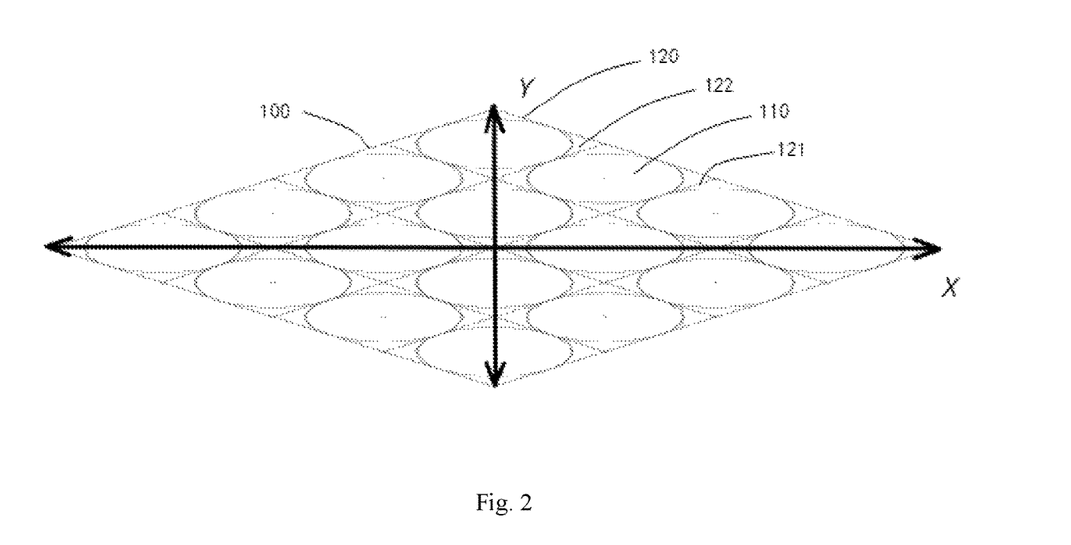
FIG. 2 is a schematic diagram of a stretched heat dissipation structure using a single layer of heat conduction mesh according to an embodiment of the present disclosure.
Figure 3:
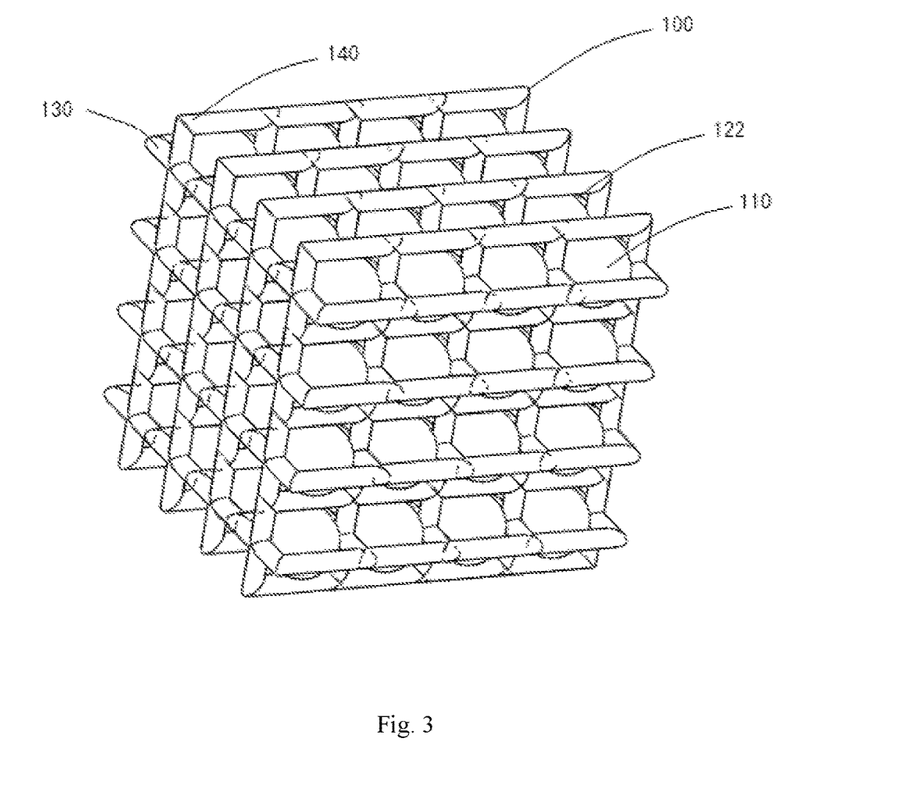
FIG. 3 is a schematic diagram of a heat dissipation structure using a plurality of heat conduction meshes according to an embodiment of the present disclosure.

As shown in FIGS. 1 to 3, an embodiment of the present disclosure provides a heat dissipation structure 100. The heat dissipation structure 100 includes a plurality of elastic heat conduction units 110 and at least one layer of heat conduction mesh 120. The heat conduction mesh 120 includes a plurality of interlaced mesh wires 121, each two interlaced mesh wires 121 are rotatable relative to each other, and the plurality of mesh wires 121 are interlaced to form gaps 122 in which the elastic heat conduction units 110 are arranged.

In this embodiment, when the heat conduction mesh 120 is stretched by an external force, the length of the heat conduction mesh 120 along a direction of stretching by the external force will be increased due to stretching, and the length perpendicular to the direction of stretching by the external force will be decreased due to shrinkage. According to the microstructure shown in FIGS. 1 and 2, for example, when the heat conduction mesh 120 is stretched along an X-axis direction, the interlaced mesh wires 121 are rotated relative to one another, and the gaps 122 formed by the interlaced mesh wires 121 are changed from a square arrangement into a rhombic arrangement. As a result, in the X-axis direction, the length of the heat conduction mesh 120 is increased due to stretching, and in a Y-axis direction, the length of the heat conduction mesh 120 is decreased due to shrinkage. At the same time, since the elastic heat conduction units 110 are arranged in the gaps 122, the elastic heat conduction units 110 are also driven by the mesh wires 121 to deform along with the gaps 122, that is, the elastic heat conduction units 110 are deformed in consistence with the heat conduction mesh 120. When the external force applied on the heat conduction mesh 120 in the X-axis direction is released, the elastic heat conduction units 110 recover from elastic deformation and drive the heat conduction mesh 120 to be restored to its original state. Therefore, the whole heat dissipation structure 100 can be stretched and shrunk to meet the distance difference between the folded state and unfolded state of the foldable terminal device, and will not be broken even when bent or stretched. Moreover, since the elastic heat conduction units 110 with elastic deformability are arranged in the gaps 122 of the heat conduction mesh 120, heat conduction property can be increased, thus meeting the requirement of the foldable terminal device for heat dissipation. In addition, when the heat conduction mesh 120 is in a stretched state, the gaps 122 are compressed, so the air in the gaps 122 is also squeezed, thereby further improving the heat dissipation property of the heat dissipation structure 100.

It should be pointed out that there may be a single layer of heat conduction mesh 120 or multiple layers of heat conduction meshes 120. According to the microstructure shown in FIG. 3, for the heat dissipation structure 100 with multiple layers of heat conduction meshes 120, under the conditions that the requirements for different heat dissipation material thicknesses are met and the space of a structural design allows, the heat flux of the heat dissipation structure 100 can be further increased to achieve a better overall heat dissipation performance of the foldable terminal device.

In an embodiment, a plurality of elastic heat conduction units 110 are evenly arranged in the heat conduction mesh 120.

In this embodiment, the plurality of elastic heat conduction units 110 are evenly arranged in the heat conduction mesh 120. That is, the gaps 122 formed by the interlaced the mesh wires 121 in the heat conduction mesh 120 are approximately equal, so are the sizes of all the elastic heat conduction units 110, such that the plurality of elastic heat conduction units 110 can be evenly arranged in the heat conduction mesh 120, which not only makes the heat dissipation effect of the heat conduction mesh 120 more uniform, but also further improves the stretchability and shrinkability of the heat conduction mesh 120. Based on this, the whole heat dissipation structure 100 can be stretched and shrunk to meet the distance difference between the folded state and unfolded state of the foldable terminal device, and will not be broken even when bent or stretched.

In an embodiment, the elastic heat conduction unit 110 is a mixture including alumina and silica micropowder.

The elastic heat conduction unit 110 may be made of a material with high elastic and heat conduction properties, such as aluminum oxide, magnesium oxide, zinc oxide, aluminum nitride, boron nitride, silicon carbide, and the like. In this embodiment, the mixture including, but not limited to, the aluminum oxide and silica micropowder has excellent elastic and heat conduction properties, and the aluminum oxide is micron-sized. It should be pointed out that the use of a mixture mainly including the aluminum oxide and silica micropowder is merely a preferred embodiment. On the basis of the aluminum oxide and silica micropowder, carbon nanotube powder or graphene oxide powder may also be added for technological processing to further improve the heat conduction property. By arranging the elastic heat conduction units 110 in the gaps 122 of the heat conduction mesh 120, it is ensured that the heat dissipation property of the heat conduction mesh 120 will not be weakened due to a large number of gaps 122. Therefore, by arranging the elastic heat conduction units 110 with elastic deformability in the gaps 122 of the heat conduction mesh 120, the heat conduction property can be increased, thus meeting the requirement of the foldable terminal device for heat dissipation.

In an embodiment, the mesh wires 121 are carbon fiber nanotubes.

The mesh wires 121 may be made of a micro heat conduction material with ultra-high heat conduction property, which includes, but not limited to, carbon nanotube fibers. In this embodiment, using the carbon nanotube fibers to make the mesh wires 121 is merely a preferred embodiment. In an embodiment, the carbon nanotube fibers are formed into a micro mesh structure by a warp and weft weaving method, so as to form the heat conduction mesh 120. The plurality of mesh wires 121 of the heat conduction mesh 120 are interlaced with one another to form the gaps 122, and the gaps 122 can be changed from a square arrangement into a rhombic arrangement as the heat conduction mesh 120 is stretched. Since the elastic heat conduction units 110 are arranged in the gaps 122, when the heat conduction mesh 120 is stretched, the elastic heat conduction units 110 are also deformed along with the gaps 122 under the drive of the mesh wires 121, so that the elastic heat conduction units 110 are deformed in consistence with the heat conduction mesh 120, and thus, the whole heat dissipation structure 100 can be stretched and shrunk.

In an embodiment, when there are multiple layers of heat conduction meshes 120, the multiple layers of heat conduction meshes 120 include at least one layer of first heat conduction mesh 130 and at least one layer of second heat conduction mesh 140 which are arranged perpendicular to each other.

In this embodiment, as shown in FIG. 3, if there are multiple layers of heat conduction meshes 120, the multiple layers of heat conduction meshes 120 form a three-dimensional (3D) structure through a processing technology. The three-dimensional structure includes at least one layer of first heat conduction mesh 130 and at least one layer of second heat conduction mesh 140 which are arranged perpendicular to each other, such that the first heat conduction mesh 130 and the second heat conduction mesh 140 are interlaced with each other to form gaps 122 in which elastic heat conduction units 110 are arranged. For the heat dissipation structure 100 with multiple layers of heat conduction meshes 120, under the conditions that the requirement for heat dissipation thickness is met and the space of a structural design allows, the heat flux of the heat dissipation structure 100 can be further increased to achieve a better overall heat dissipation performance of the foldable terminal device.

In an embodiment, the first heat conduction mesh 130 and the second heat conduction mesh 140 are integrally formed.

In this embodiment, as shown in FIG. 3, the first heat conduction mesh 130 and the second heat conduction mesh 140 are not only interlaced but also integrally formed. That is, the multiple layers of heat conduction meshes 120 are not spliced together by a layer-by-layer combination method, but are manufactured through integral forming.

Figure 4:
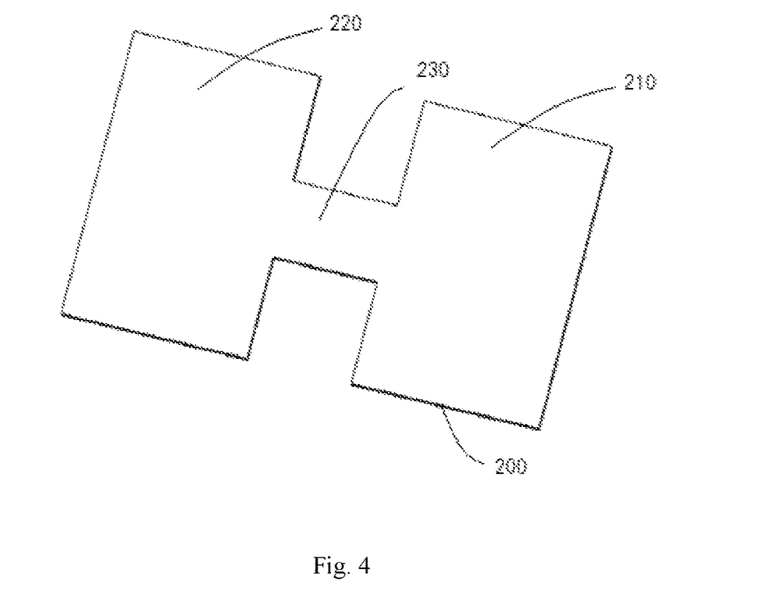
FIG. 4 is a schematic structural diagram of a heat dissipation component according to an embodiment of the present disclosure.

As shown in FIG. 4, an embodiment of the present disclosure further provides a heat dissipation component 200, which includes a heat dissipation structure 100.

In an embodiment, since the heat dissipation component 200 adopts the heat dissipation structure 100, macroscopically, the heat dissipation component 200 also has the stretching and shrinking properties and heat dissipation property of the heat dissipation structure 100. Based on this, the heat dissipation component 200 can be stretched and shrunk to meet the distance difference between the folded state and unfolded state of the foldable terminal device and will not be broken even when bent or stretched in an application scenario of the foldable terminal device.

It should be pointed out that since the heat dissipation component 200 achieves good stretching and shrinking properties on the basis of the use of the heat dissipation structure 100, the heat dissipation component 200 can be applied in a scenario where stretching to a certain extent is required, without having to be macroscopically folded in any way, and therefore the heat dissipation component 200 will not be constrained by the structure of the foldable terminal device and has high universality.

Figure 5:
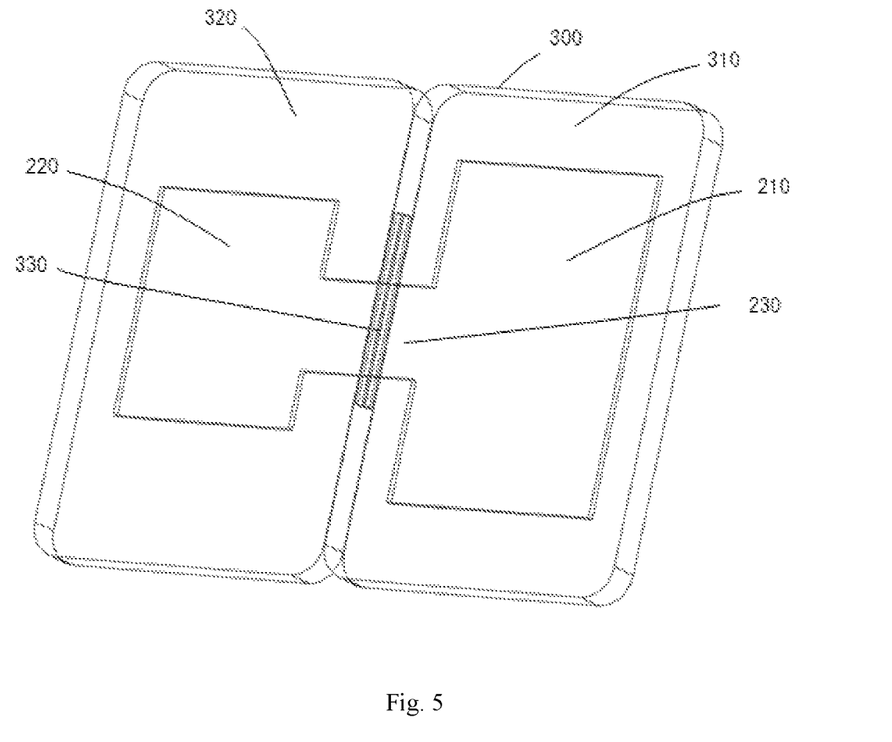
FIG. 5 is a schematic structural diagram of a foldable terminal device according to an embodiment of the present disclosure.

As shown in FIG. 5, an embodiment of the present disclosure further provides a foldable terminal device. The foldable terminal device includes a housing 300 and a heat dissipation component 200. The housing 300 is provided a first heat dissipation surface 310 and a second heat dissipation surface 320 which are rotatable relative to each other, and a slit 330 is arranged between the first heat dissipation surface 310 and the second heat dissipation surface 320. The heat dissipation component 200 includes a first heat dissipation part 210, a second heat dissipation part 220, and a connecting part 230. The first heat dissipation part 210 is arranged on the first heat dissipation surface 310, the second heat dissipation part 220 is arranged on the second heat dissipation surface 320, and the connecting part 230 is connected with the first heat dissipation part 210 and the second heat dissipation part 220 respectively, and passes through the slit 330. The first heat dissipation part 210, the second heat dissipation part 220 and the connecting part 230 are each composed of the heat dissipation structure 100.

It should be pointed out that the foldable terminal device includes, but is not limited to, a foldable mobile phone.

Figure 6:
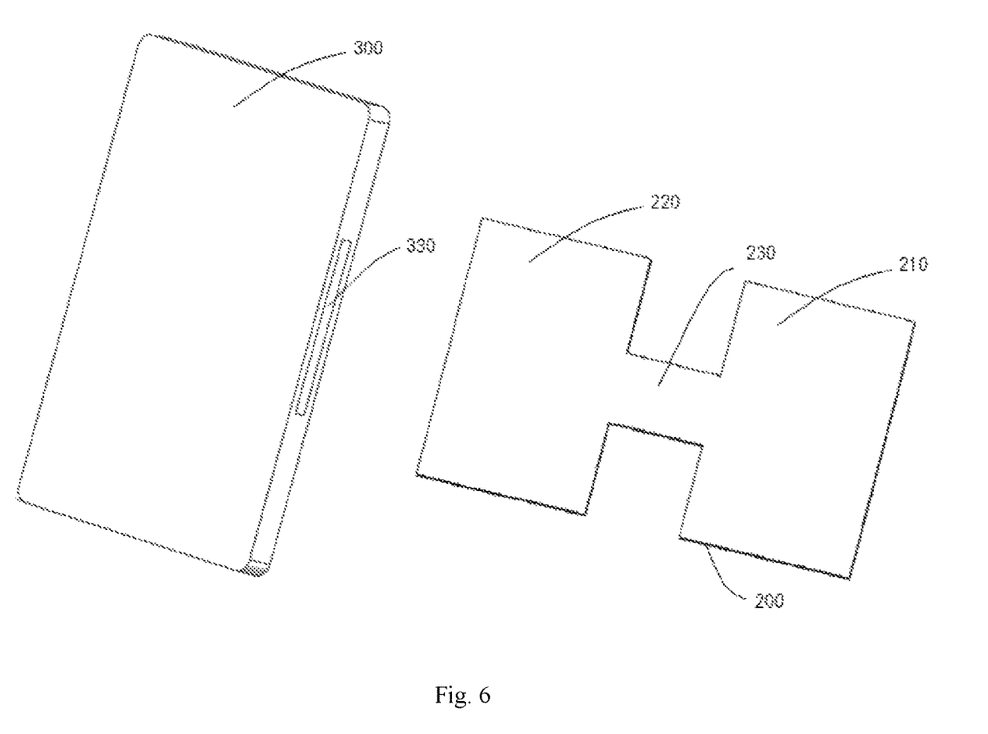
FIG. 6 is a schematic structural diagram of a heat dissipation component and a foldable terminal device according to an embodiment of the present disclosure.
Figure 7:
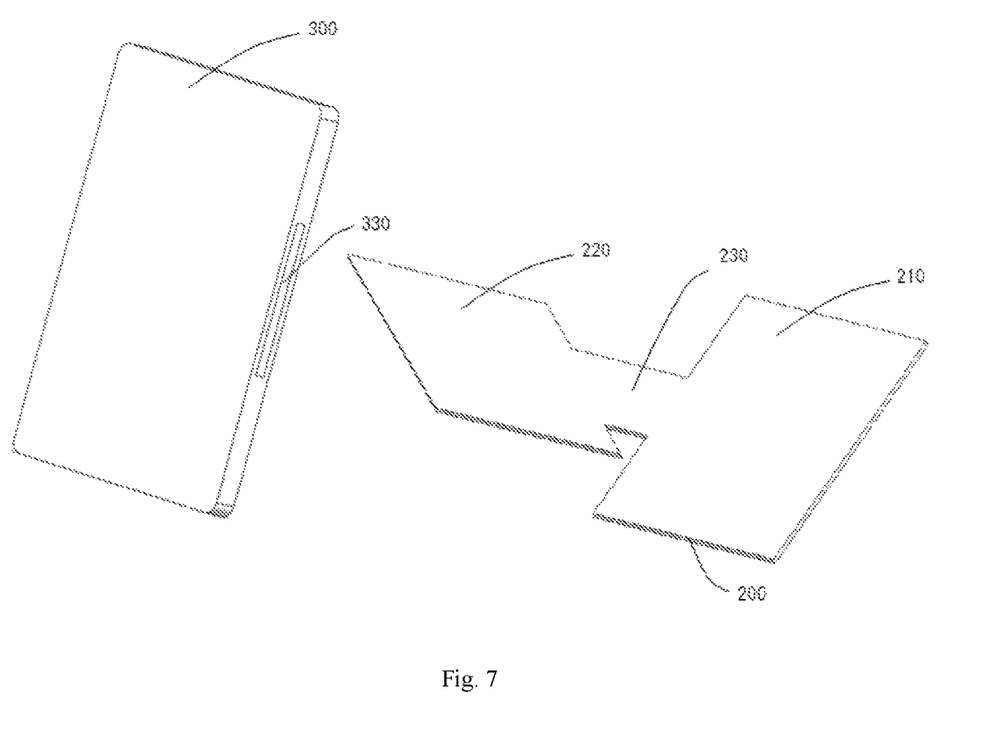
FIG. 7 is a schematic structural diagram of a pulled heat dissipation component and a foldable terminal device according to an embodiment of the present disclosure.

In an embodiment, taking the foldable mobile phone as an example, generally, heating sources such as internal elements of the foldable mobile phone are all arranged on the left side, but only the battery is arranged on the right side. As a result, in some scenarios of usage by users, the maximum temperature difference between the left and right sides of the foldable mobile phone is more than 10° C., resulting in poor user experience. As shown in FIGS. 6 and 7, since the first heat dissipation part 210, the second heat dissipation part 220 and the connecting part 230 are each made of the heat dissipation structure 100, the heat dissipation component 200 has stretching and shrinking properties, and therefore can easily pass through the slit 330 between the first heat dissipation surface 310 and the second heat dissipation surface 320 of the foldable mobile phone. In an embodiment, the first heat dissipation part 210 is arranged on the first heat dissipation surface 310, the second heat dissipation part 220 is arranged on the second heat dissipation surface 320, and the connecting part 230 passes through the slit 330. In addition, since the connecting part 230 is connected with the first heat dissipation part 210 and the second heat dissipation part 220 respectively, which is equivalent to building a heat dissipation path between the first heat dissipation part 210 and the second heat dissipation part 220, an effect of temperature equalization is achieved to effectively reduce the temperature difference between the first heat dissipation part 210 and the second heat dissipation part 220, thereby improving the user experience.

Moreover, since the first heat dissipation part 210, the second heat dissipation part 220 and the connecting part 230 are each composed of the heat dissipation structure 100, the heat dissipation component 200 also has good heat dissipation property, thus meeting the requirement of the foldable terminal device for heat dissipation.

After the foldable terminal device is folded, the heat dissipation component 200 passing through the slit 330 receives an external force in the X direction. Since the heat dissipation component 200 has the properties of the heat dissipation structure 100, the heat dissipation component 200 is stretchable in an X direction, and therefore can be stretched. After the foldable terminal device is unfolded, the external force received by the heat dissipation component 200 in the X direction is released, and the heat dissipation component 200 is restored to its original state. Therefore, the heat dissipation component 200 can meet the requirement of the distance difference between the folded state and unfolded state of the foldable terminal device.

Based on this, the heat dissipation component 200 according to this embodiment can be stretched and shrunk to meet the distance difference between the folded state and unfolded state of the foldable terminal device and will not be broken even when bent or stretched, thus meeting the requirement of the foldable terminal device for heat dissipation.

Figure 8:
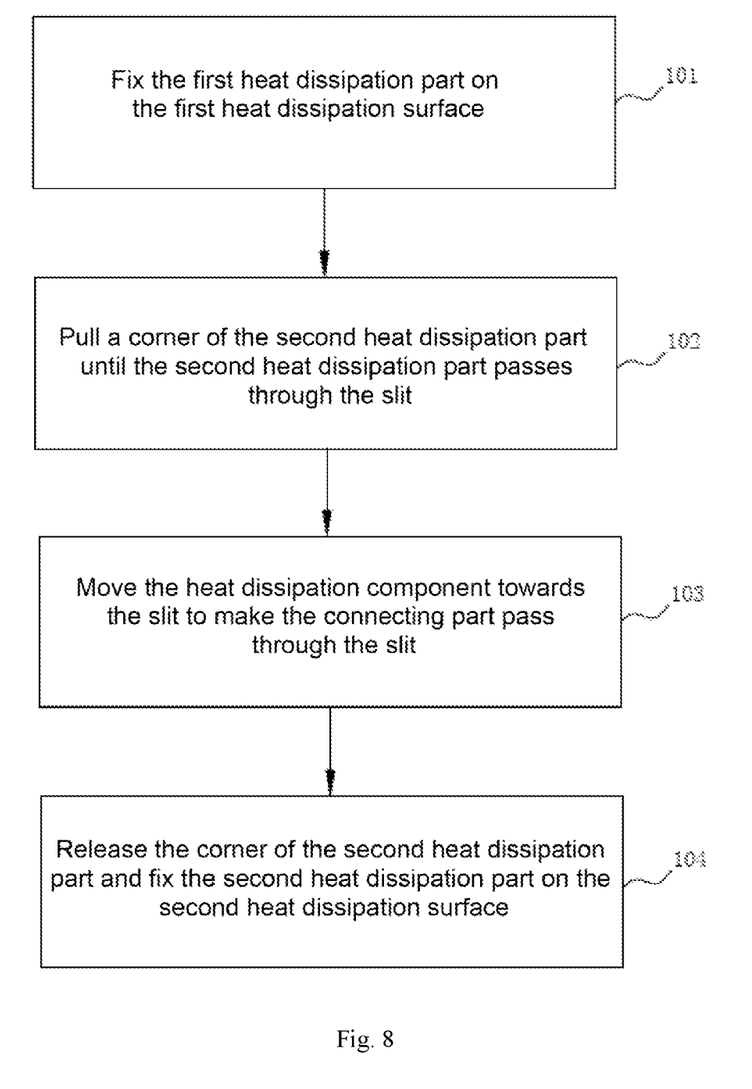
FIG. 8 is a flow chart of a mounting method for a heat dissipation component according to an embodiment of the present disclosure.

As shown in FIG. 8, an embodiment of the present disclosure further provides a mounting method for a heat dissipation component, which is applied to a foldable terminal device. The foldable terminal device includes a housing and the heat dissipation component. The housing is provided with a first heat dissipation surface and a second heat dissipation surface which are rotatable relative to each other, and a slit is arranged between the first heat dissipation surface and the second heat dissipation surface. The heat dissipation component includes a first heat dissipation part, a second heat dissipation part, and a connecting part connected with the first heat dissipation part and the second heat dissipation part respectively. The method includes, but is not limited to, the following steps S101 to S104.

At S101, the first heat dissipation part is fixed on the first heat dissipation surface.

At S102, a corner of the second heat dissipation part is pulled until the second heat dissipation part passes through the slit.

At S103, the heat dissipation component is moved towards the slit, to make the connecting part pass through the slit.

At S104, the corner of the second heat dissipation part is released, and the second heat dissipation part is fixed on the second heat dissipation surface.

In an embodiment, the first heat dissipation part is first fixed on the first heat dissipation surface; then the corner of the second heat dissipation part is pulled until the second heat dissipation part passes through the slit; and then the heat dissipation component is then moved towards the slit to make the connecting part pass through the slit; and finally, the corner of the second heat dissipation part is released and the second heat dissipation part is fixed on the second heat dissipation surface. The whole mounting process is simple, convenient and easy to operate. The fixing method includes, but is not limited to, electrostatic attraction.

In an embodiment, as shown in FIG. 7, after the corner of the heat dissipation component is pulled, and the heat dissipation component is stretched along the X-axis direction, the size of the heat dissipation component will be reduced in the Y-axis direction. Thus, the heat dissipation component can pass through the limited slit to build a heat dissipation path for the first heat dissipation surface and the second heat dissipation surface located on the left and right sides of the foldable terminal device, thus playing a role of temperature equalizing to effectively reduce the temperature difference between the first heat dissipation part and the second heat dissipation part and improve the user experience.

It should be pointed out that since the heat dissipation component achieves good stretching and shrinking properties on the basis of the use of the heat dissipation structure, the heat dissipation component can be applied in a scenario where stretching to a certain extent is required, without having to be macroscopically folded in any way, and therefore the heat dissipation component will not be constrained by the structure of the foldable terminal device and has high universality. Therefore, the heat dissipation component can be stretched and shrunk to meet the distance difference between the folded state and unfolded state of the foldable terminal device, and will not be broken even when bent or stretched.

In addition, an embodiment of the present disclosure further provides a foldable terminal device, which includes a heat dissipation structure or a heat dissipation component.

In an embodiment, the foldable terminal at least includes the heat dissipation structure. The heat dissipation structure includes a plurality of elastic heat conduction units and at least one layer of heat conduction mesh. The heat conduction mesh includes a plurality of interlaced mesh wires, each two interlaced mesh wires are rotatable relative to each other, and the plurality of mesh wires are interlaced to form gaps in which the elastic heat conduction units are arranged. Therefore, when the heat conduction mesh is stretched by an external force, the length of the heat conduction mesh along a direction of stretching by the external force will be increased due to stretching, the length perpendicular to the direction of stretching by the external force will be decreased due to shrinkage. At the same time, the elastic heat conduction units will be deformed as well under the drive of the mesh wires, and will be deformed in consistence with the heat conduction mesh. After the external force received by the heat conduction mesh in the X-axis direction is released, the elastic heat conduction units will recover from elastic deformation to drive the heat conduction mesh to be restored to its original state. Consequently, the whole heat dissipation structure can be stretched and shrunk to meet the distance difference between the folded state and unfolded state of the foldable terminal device, and will not be broken even when bent or stretched. Moreover, since the elastic heat conduction units with elastic deformability are arranged in the gaps of the heat conduction mesh, heat conduction property can be increased, thus meeting the requirement of the foldable terminal device for heat dissipation. In addition, when the heat conduction mesh is in a stretched state, the gaps are compressed, so the air in the gaps is also squeezed, thus further improving the heat dissipation property of the heat dissipation structure. For the heat dissipation structure with multiple layers of heat conduction meshes, under the conditions that the requirements for different heat dissipation material thicknesses are met and the space of a structural design allows, the heat flux of the heat dissipation structure can be further increased to achieve a better overall heat dissipation performance of the foldable terminal device. Therefore, since the heat dissipation structure can be stretched and shrunk and will not be broken when bent, the requirement of the foldable terminal device for heat dissipation can be met.

Likewise, when the foldable terminal device includes the heat dissipation component, since the heat dissipation component adopts the heat dissipation structure, macroscopically, the heat dissipation component also has the stretching and shrinking properties and heat dissipation property of the heat dissipation structure. Based on this, the heat dissipation component can be stretched and shrunk to meet the distance difference between the folded state and unfolded state of the foldable terminal device and will not be broken even when bent or stretched in an application scenario of the foldable terminal device, thus meeting the requirement of the foldable terminal device for heat dissipation.

According to the embodiments of the present disclosure, the heat dissipation structure includes a plurality of elastic heat conduction units and at least one layer of heat conduction mesh. The heat conduction mesh includes a plurality of interlaced mesh wires, each two interlaced mesh wires are rotatable relative to each other, and the plurality of mesh wires are interlaced to form gaps in which the elastic heat conduction units are arranged. Therefore, when the heat conduction mesh is stretched by an external force, the length of the heat conduction mesh along a direction of stretching by the external force will be increased due to stretching, the length perpendicular to the direction of stretching by the external force will be decreased due to shrinkage. At the same time, the elastic heat conduction units will be deformed under the drive of the mesh wires, and will be deformed in consistence with the heat conduction mesh. Consequently, the whole heat dissipation structure can be stretched and shrunk to meet the distance difference between the folded state and unfolded state of the foldable terminal device, and will not be broken even when bent or stretched. Moreover, since the elastic heat conduction units with elastic deformability are arranged in the gaps of the heat conduction mesh, heat conduction property can be increased, thus meeting the requirement of the foldable terminal device for heat dissipation. In addition, for the heat dissipation structure with multiple layers of heat conduction meshes, under the conditions that the requirements for different heat dissipation material thicknesses are met and the space of a structural design allows, the heat flux of the heat dissipation structure can be further increased to achieve a better overall heat dissipation performance of the foldable terminal device. Therefore, since the heat dissipation structure according to this embodiment can be stretched and shrunk and will not be broken when bent, the requirement of the foldable terminal device for heat dissipation can be met.

Some embodiments of the present disclosure have been described in detail above, but the present disclosure is not limited thereto. Those having ordinary skills in the art can also make various equivalent modifications or replacements without violating the shared conditions of the scope of the present disclosure, and these equivalent modifications or replacements shall be included in the scope defined by the claims of the present disclosure.

What is claimed is:

1. A heat dissipation structure, comprising:
   a plurality of elastic heat conduction units; and
   at least one layer of heat conduction mesh, wherein the heat conduction mesh comprises a plurality of interlaced mesh wires, each two interlaced mesh wires are rotatable relative to each other, and the plurality of mesh wires are interlaced to form gaps in which the elastic heat conduction units are arranged.

2. The heat dissipation structure of claim 1, wherein the plurality of elastic heat conduction units are evenly arranged in the heat conduction mesh.

3. The heat dissipation structure of claim 2, wherein the elastic heat conduction unit is a mixture comprising aluminum oxide and silicon micropowder.

4. The heat dissipation structure of claim 1, wherein the elastic heat conduction unit is a mixture comprising aluminum oxide and silicon micropowder.

5. The heat dissipation structure of claim 1, wherein the mesh wires are carbon nanotube fibers.

6. The heat dissipation structure of claim 1, wherein in response to a presence of multiple layers of heat conduction meshes, the multiple layers of heat conduction meshes comprise at least one layer of first heat conduction mesh and at least one layer of second heat conduction mesh, which are arranged perpendicular to each other.

7. The heat dissipation structure of claim 6, wherein the first heat conduction mesh and the second heat conduction mesh are integrally formed.

8. A foldable terminal device, comprising the heat dissipation structure of claim 1.

9. A heat dissipation component, comprising a heat dissipation structure, the heat dissipation structure comprising:
- a plurality of elastic heat conduction units; and
- at least one layer of heat conduction mesh, wherein the heat conduction mesh comprises a plurality of interlaced mesh wires, each two interlaced mesh wires are rotatable relative to each other, and the plurality of mesh wires are interlaced to form gaps in which the elastic heat conduction units are arranged.

10. A foldable terminal device, comprising a housing and the heat dissipation component of claim 9, wherein the housing is provided with a first heat dissipation surface and a second heat dissipation surface which are rotatable relative to each other, and a slit is arranged between the first heat dissipation surface and the second heat dissipation surface; and the heat dissipation component comprises:
- a first heat dissipation part, arranged on the first heat dissipation surface;
- a second heat dissipation part, arranged on the second heat dissipation surface; and
- a connecting part, connected with the first heat dissipation part and the second heat dissipation part respectively, the connecting part passing through the slit;
  - wherein the first heat dissipation part, the second heat dissipation part and the connecting part are each composed of the heat dissipation structure.

11. A mounting method for a heat dissipation component, which is applied to a foldable terminal device, the foldable terminal device comprising a housing and the heat dissipation component of claim 9,
the housing being provided with a first heat dissipation surface and a second heat dissipation surface which are rotatable relative to each other,
a slit being arranged between the first heat dissipation surface and the second heat dissipation surface, the heat dissipation component comprising a first heat dissipation part, a second heat dissipation part, and a connecting part connected with the first heat dissipation part and the second heat dissipation part respectively, and
the method comprising:
- fixing the first heat dissipation part on the first heat dissipation surface;
- pulling a corner of the second heat dissipation part until the second heat dissipation part passes through the slit;
- moving the heat dissipation component towards the slit to make the connecting part pass through the slit; and
- releasing the corner of the second heat dissipation part and fixing the second heat dissipation part on the second heat dissipation surface.

12. A foldable terminal device, comprising the heat dissipation component of claim 9.

* * * * *